United States Patent [19]

Kawasaki

[11] Patent Number: 5,670,909
[45] Date of Patent: Sep. 23, 1997

[54] SEMICONDUCTOR DEVICE HAVING A BOOSTING CIRCUIT

[75] Inventor: Kenichi Kawasaki, Kawasaki, Japan

[73] Assignee: Fujitsu Limited, Kawasaki, Japan

[21] Appl. No.: 606,821

[22] Filed: Feb. 26, 1996

[30] Foreign Application Priority Data

Jun. 19, 1995 [JP] Japan .................. 7-151227

[51] Int. Cl.$^6$ .................................................. G05F 1/10
[52] U.S. Cl. .................... 327/543; 327/333; 327/390; 327/589
[58] Field of Search ........................ 327/333, 390, 327/543, 536, 589

[56] References Cited

U.S. PATENT DOCUMENTS

| | | | |
|---|---|---|---|
| 4,570,244 | 2/1986 | Sud et al. ................... | 327/390 |
| 4,689,495 | 8/1987 | Liu ............................. | 327/390 |
| 4,689,496 | 8/1987 | Kerber et al. ............... | 327/390 |
| 4,904,888 | 2/1990 | Yamauchi et al. .......... | 327/390 |

FOREIGN PATENT DOCUMENTS

401177714 A  7/1989  Japan ...................... 327/390

Primary Examiner—Margaret Rose Wambach
Attorney, Agent, or Firm—Staas & Halsey

[57] ABSTRACT

A semiconductor device includes a boost circuit and a boost control circuit, wherein the boost control circuit comprises a first transistor connected to a load for outputting a boost voltage supplied thereto from a boost circuit to the load, a second transistor connected to the first transistor and further to the load, the second transistor being biased to turn on permanently, and a third transistor connected to the load via the second transistor, wherein the second transistor has a conductance exceeding a conductance of the third transistor.

22 Claims, 9 Drawing Sheets

SEMICONDUCTOR DEVICE HAVING A BOOSTING CIRCUIT

BACKGROUND OF THE INVENTION

The present invention generally relates to semiconductor devices and more particularly to a semiconductor device having a boost control circuit used for controlling supply of a boost voltage.

Boost control circuits are used commonly in semiconductor devices including semiconductor integrated circuits for controlling a boost voltage produced by a boosting circuit.

With the progress in miniaturization of semiconductor patterns, recent semiconductor devices tend to suffer from the problem of insufficient breakdown voltage. Associated with this, deterioration of transistors caused by hot carriers is becoming a paramount problem.

In the case of dynamic random access memories (DRAMs), a boost control circuit is used for supplying a boost voltage at the time of writing data, while use of such a boost voltage raises the problem of serious degradation of transistors caused by hot carriers.

Figure 1:
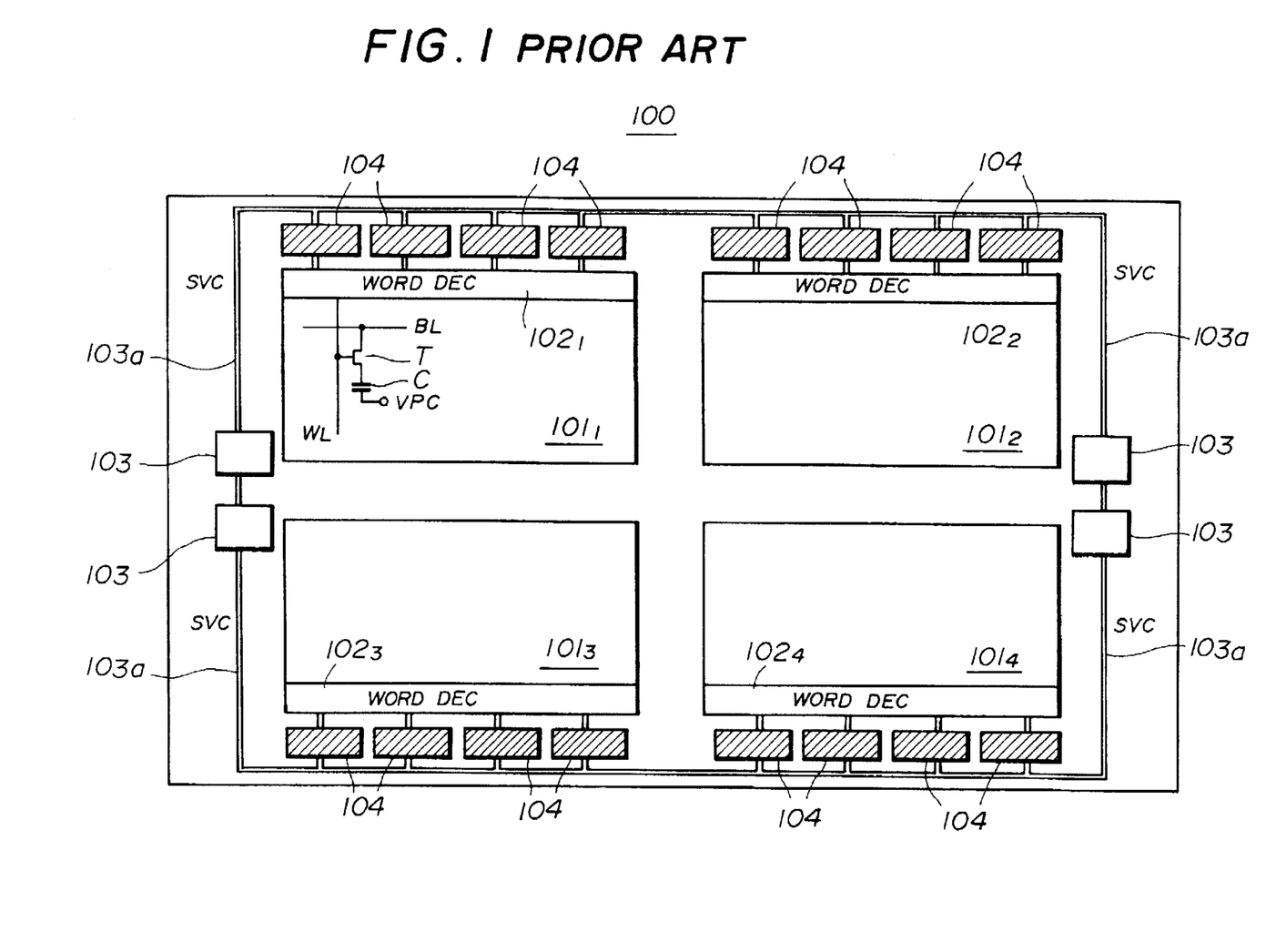
FIG. 1 is a block diagram showing the construction of a DRAM having a boost control circuit.

FIG. 1 shows the construction of a DRAM 100 that uses a boost control circuit in the form of a block diagram.

Referring to FIG. 1, the DRAM 100 includes a plurality of memory cell arrays $101_1$, $101_2$, $101_3$, $1-1_4$, ... formed on a common semiconductor chip, wherein each of the memory cell arrays includes an array of memory cells, each of which in turn includes a memory cell capacitor C and a transfer gate transistor T. It should be noted that the memory cell capacitor C is connected to a drain of the transistor T, while the transistor T has a source connected to a bit line BL as is well known in the art. Further, the transistor T has a gate connected to a word line WL, wherein each of the word lines WL is connected, in each of the memory cell arrays such as the memory cell array $101_1$, to a corresponding word decoder that forms, together with other word decoders in the memory cell array, a word decoder array $102_1$. Similar word decoder arrays $102_2$, $102_3$, $102_4$, ... are formed also in the memory cell arrays $101_2$, $101_3$, $101_4$, respectively. Each of the word decoders is supplied with address data and selects a word line WL in response thereto. Further, each of the memory cell arrays is provided with a bit decoder (not shown) such that the bit decoder is supplied with address data and selects a corresponding bit line in response thereto.

In order to enable writing of data, the DRAM 100 further includes a boost circuit 103 at various locations of the chip for producing a boost voltage, wherein the boost voltage thus produced is supplied to a word decoder array such as the word decoder array $102_1$ via a conductor pattern $103a$ extending on the chip and further via a boost control circuit 104.

Figure 2:
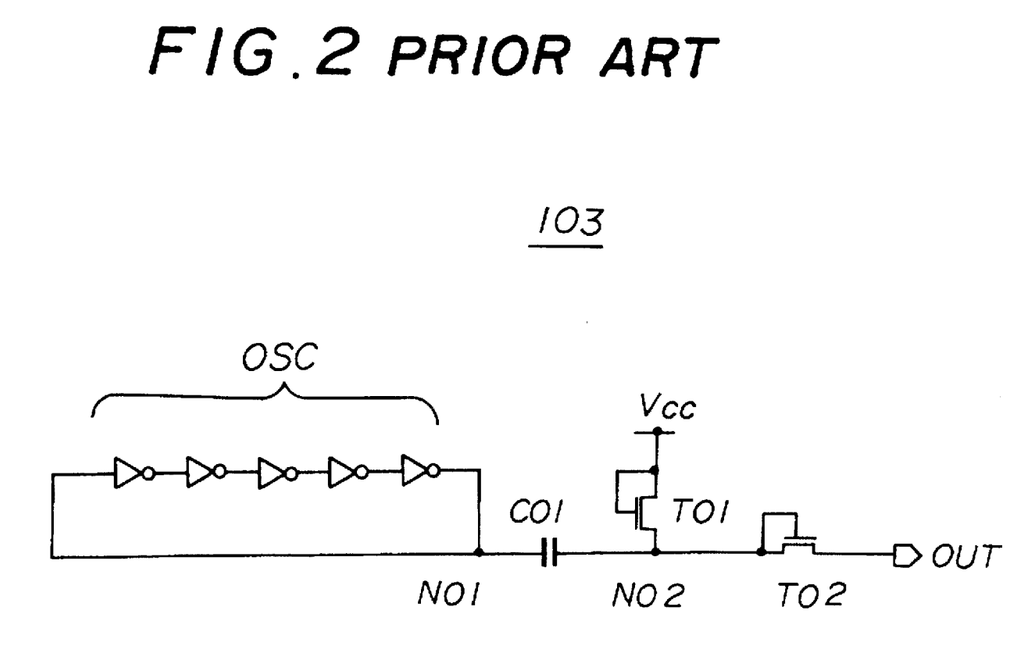
FIG. 2 is a circuit diagram showing the construction of a boost circuit used in the DRAM of FIG. 1.

FIG. 2 is a circuit diagram showing the construction of the boost circuit 103 used in the DRAM of FIG. 1.

Referring to FIG. 2, the boost circuit 103 includes a ring oscillator OSC formed of a serial connection of inverters and a pumping capacitor $C_{01}$ connected to the oscillator OSC at an output node $N_{01}$ thereof. Further, a normally-on precharge transistor $T_{01}$ is connected to the pumping capacitor $C_{01}$ at an opposite node $N_{02}$. Thus, when the level of the node $N_{01}$ goes low to zero in response to the oscillation of the ring oscillator OSC, the pumping capacitor $C_{01}$ is charged up to the Vcc level by the precharge transistor $T_{01}$ such that the level of the node $N_{02}$ becomes Vcc-Vth, where Vth is the threshold voltage of the transistor $T_{01}$. In the next phase of oscillation of the ring oscillator OSC, the level of the node $N_1$ goes high to the level Vcc, and the level of the node $N_{02}$ is now pushed up to the level of 2Vcc-Vth. The voltage at the node $N_2$ thus boosted is supplied to the conductor pattern $103a$ with the level of 2Vcc-2Vth via a transistor $T_{02}$ that acts as a diode for preventing the return flow of the electric charges from the conductor pattern $103a$ during the low level cycle of the ring oscillator OSC. The transistor $T_{02}$ also has a threshold voltage of Vth.

Figure 3:
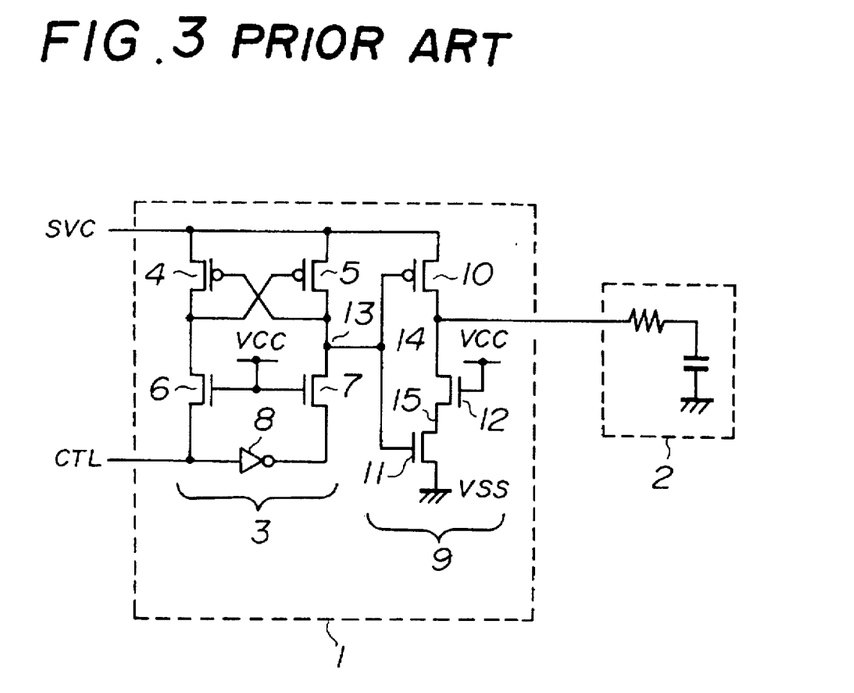
FIG. 3 is a circuit diagram showing the construction of a conventional boost control circuit used in the DRAM of FIG. 1.

FIG. 3 shows the construction of a boost control circuit 1 used conventionally in the DRAM of FIG. 1 for controlling a supply of boost voltage, together with a load 2 cooperating therewith. The load 2 may be a word line WL to which the boost voltage is supplied.

Referring to FIG. 3, the boost control circuit 1 includes a level conversion circuit 3 supplied with a boost voltage SVC from an external boosting circuit such as the one shown in FIG. 2, with a control signal CTL that changes the level thereof between a Vcc (supply voltage) level and a Vss (ground) level, and an output circuit 9 that outputs the boost voltage SVC to the load 2 under control of the level conversion circuit 3.

More specifically, the level conversion circuit 3 converts the high level (Vcc level) of the control signal CTL to the level of the foregoing boost voltage SVC and includes a pair of p-channel MOS transistors 4 and 5 cross coupled with each other. Thus, each of the transistors 4 and 5 has a source connected to a line carrying the SVC voltage and a drain connected to a gate of the other of the transistors 4 and 5. The p-channel MOS transistor 4 is connected to a line carrying the control signal CTL via an n-channel MOS transistor 6 of which gate is held at the Vcc level, while the p-channel MOS transistor 5 is connected to the foregoing line carrying the CTL signal via another n-channel MOS transistor 7 and an inverter 8.

The output circuit 9, in turn, includes a p-channel MOS transistor 10 connected in series with an n-channel MOS transistor 11 across the SVC level and the Vss level, with an intervening n-channel MOS transistor 12 interposed between the transistors 10 and 11. Both of the transistors 10 and 11 have respective gates connected commonly to a node 13 of the level conversion circuit 3 where the transistors 5 and 7 are connected, while the transistor 12 has a gate held at the Vcc level. Thereby, the output circuit 9 supplies the output voltage at a node 14 where the transistors 10 and 12 are connected. It should be noted that the transistor 10 charges the load 2 when turned on, while the transistor 11 discharges the load 2 when turned on. The transistor 12, on the other hand, relaxes the voltage applied across the source and drain of the n-channel MOS transistor 11 when the transistor 11 is turned on. In other words, the transistor 12 acts to compensate for the deterioration of the transistor 11 caused by the hot carriers.

As is well known in the art, ohmic electrodes are formed at the source and drain (diffusion regions) of the MOS transistors 10–12.

Figure 4:
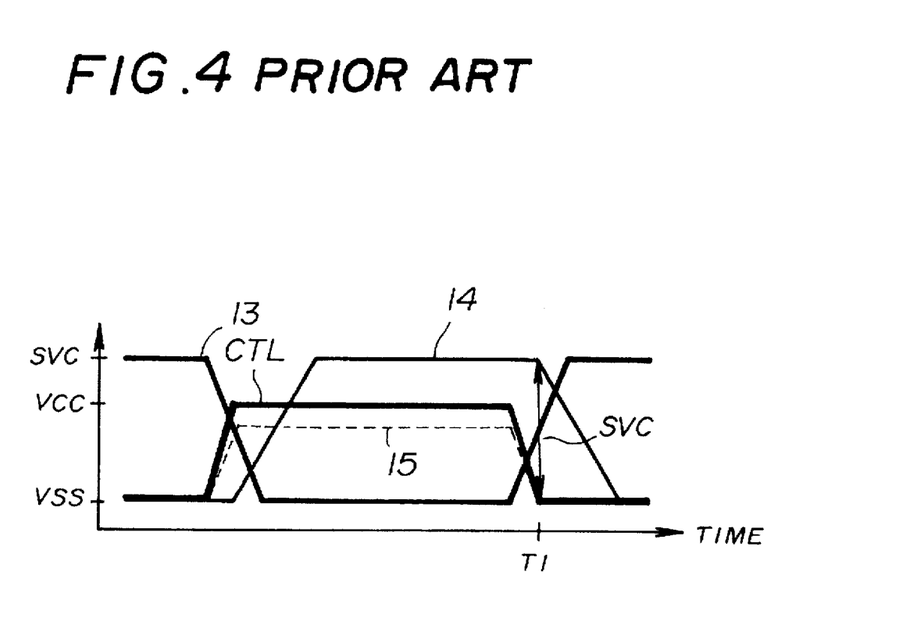
FIG. 4 is a timing chart showing the operation of the circuit of FIG. 3.

FIG. 4 is a time chart showing the operation of the boost control circuit 1. Particularly, FIG. 4 shows the change of voltage at a node 13 where the transistors 5 and 7 are connected with each other and a node 15 where the transistors 11 and 12 are connected with each other, in addition to the voltage change at the foregoing node 14 as well as the transition of the control signal CTL.

Referring to FIG. 4, it will be noted that the output of the inverter 8 is held high (Vcc level) as long as the control signal CTL is held low (Vss level), and the transistor 4 is turned off in response thereto. Associated therewith, it will be noted that the transistor 5 is turned on and the level of the node 13 is held at the SVC level. As the voltage of the node 13 is applied also to the gates of the transistors 10 and 11 of the output circuit 9, it will be noted that the transistor 10 is caused to turn off and the transistor 11 is caused to turn on, leading to the state in which the level of the nodes 14 and 15 is held at the Vss level (ground level).

When the level of the control signal CTL goes high from this state, the output of the inverter 8 goes low to the Vss level, and the p-channel MOS transistor 4 turns on while the p-channel MOS transistor 5 turns off. As a result, the voltage at the node 13 changes to the Vss level.

When the voltage at the node 13 goes low as such, the p-channel MOS transistor 10 of the output circuit 9 is caused to turn on while the n-channel MOS transistor 11 is caused to turn off, and the boost voltage SVC is supplied to the load 2 via the transistor 10. In this state, the node 14 is held at the SVC level while the node 15 is held at a level of SVC-$V_{TH}$, wherein $V_{TH}$ represents the threshold voltage of the transistor 12.

When the control signal CTL goes low in this state, the output of the inverter 8 goes high to the Vcc level, the transistor 4 is turned off and the transistor 5 is turned on. Thereby, the voltage at the node 13 returns to the SVC level.

When the voltage of the node 13 has returned to the SVC level as such, the transistor 10 turns off and the transistor 11 turns on. Thus, the electric charges accumulated in the load 2 are discharged via the transistors 12 and 11 to the ground. Associated with this, the level of the node 14 changes from the boost level SVC to the ground level Vss and the level of the node 15 changes from the level of Vcc-$V_{TH}$ to the ground level Vss.

In such a conventional boost control circuit 1, there arises a problem in that, while the voltage level of the node 15 changes to the Vss level immediately in response to the turning-on of the transistor 11, the level of the node 14 may not change to the Vss level quickly due to the large capacitance of the load 2. In such a case, a voltage approximately equal to the boost voltage SVC is applied across the source and the drain of the transistor 12 at an instance $T_1$ shown in FIG. 4, and the transistor 12, provided for preventing the deterioration of the transistor 11, experiences deterioration by the hot carriers. This problem of deterioration of the transistor 12 is particularly serious in high speed DRAMs, such as a synchronous DRAM.

SUMMARY OF THE INVENTION

Accordingly, it is a general object of the present invention to provide a novel and useful semiconductor device wherein the foregoing problems are eliminated.

Another and more specific object of the present invention is to provide a semiconductor device having a discharge transistor for discharging a load and a compensation transistor for preventing deterioration of the discharge transistor, such as a semiconductor memory device, wherein the problem of deterioration of the compensation transistor by hot carriers is successfully eliminated.

Another object of the present invention is to provide a semiconductor device, comprising:

a boost circuit for producing a boost voltage by boosting a supply voltage; and a boost control circuit supplied with said boost voltage for outputting said boost voltage to a load in response to a control signal;

said boost control circuit including:

a first transistor having a first diffusion region connected to said boost circuit and a second diffusion region adapted for connection to said load for outputting said boost voltage therefrom to said load, said first transistor being turned on when outputting said boost voltage from said second diffusion region to said load and turned off when interrupting output of said boost voltage from said second diffusion region to said load;

a second transistor having a third electrode connected electrically to said second diffusion region of said first transistor and a fourth diffusion region, said second transistor being turned on irrespective of whether or not said first transistor is turned on; and a third transistor having a fifth electrode connected electrically to said fourth diffusion region of said second transistor and a sixth electrode connected electrically to a ground level, said third transistor being turned on when interrupting output of said boost voltage from said second diffusion region to said load and turned off when outputting said boost voltage from said second diffusion region to said load;

said second transistor having a conductance exceeding a conductance of said third transistor.

Another object of the present invention is to provide a semiconductor memory device, comprising:

a memory cell array including a plurality of memory cells;

a plurality of bit lines connected to respective memory cells;

a plurality of word lines connected to respective memory cells;

a bit decoder supplied with address data for selecting a bit line in response thereto; a word decoder supplied with address data for selecting a word line in response thereto;

a boost circuit for producing a boost voltage by boosting a supply voltage; and a boost control circuit supplied with said boost voltage for outputting said boost voltage to a load in response to a control signal;

said boost control circuit including:

a first transistor having a first diffusion region connected to said boost circuit and a second diffusion region adapted for connection to said load for outputting said boost voltage therefrom to said load, said first transistor being turned on when outputting said boost voltage from said second diffusion region to said load and turned off when interrupting output of said boost voltage from said second diffusion region to said load;

a second transistor having a third electrode connected electrically to said second diffusion region of said first transistor and a fourth diffusion region, said second transistor being turned on irrespective of whether or not said first transistor is turned on; and a third transistor having a fifth electrode connected electrically to said fourth diffusion region of said second transistor and a sixth electrode connected electrically to a ground level, said third transistor being turned on when interrupting output of said boost voltage from said second diffusion region to said load and turned off when outputting said boost voltage from said second diffusion region to said load;

said second transistor having a conductance exceeding a conductance of said third transistor.

Another object of the present invention is to provide a boost control circuit, comprising:

a first transistor having a first diffusion region connected to a boost circuit for receiving therefrom a boost voltage and a second diffusion region adapted for connection to a load for outputting said boost voltage therefrom to said load, said first transistor being turned on when outputting said boost voltage from said second diffusion region to said load and turned off when interrupting output of said boost voltage from said second diffusion region to said load;

a second transistor having a third electrode connected electrically to said second diffusion region of said first transistor and a fourth diffusion region, said second transistor being turned on irrespective of whether or not said first transistor is turned on; and a third transistor having a fifth electrode connected electrically to said fourth diffusion region of said second transistor and a sixth electrode connected electrically to a ground level, said third transistor being turned on when interrupting output of said boost voltage from said second diffusion region to said load and turned off when outputting said boost voltage from said second diffusion region to said load;

said second transistor having a conductance exceeding a conductance of said third transistor.

According to the present invention, the first transistor charges the load while the third transistor discharges the load via the second transistor, wherein the level of the node at which the fourth diffusion region and the fifth diffusion region are connected changes relatively slowly when the third transistor is turned on, due to the increased conductance or current drive power of the second transistor. More specifically, the depletion of the electric charges at the foregoing node, caused as a result of the turning-on of the third transistor, is immediately compensated for through the second transistor having a large conductance, and the voltage drop across the third and fourth diffusion regions of the second transistor is minimized. Thereby, the problem of deterioration of the second transistor caused by the hot carriers is successfully eliminated.

Other objects and further features of the present invention will become apparent from the following detailed description when read in conjunction with the attached drawings.

DETAILED DESCRIPTION OF THE PREFERRED EMBODIMENTS

Figure 5:
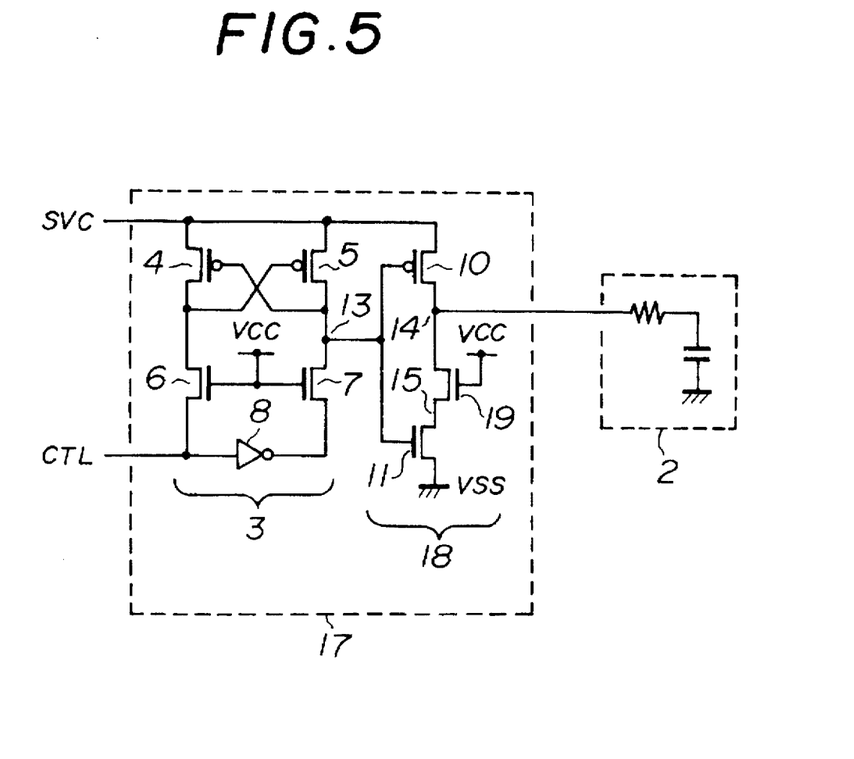
FIG. 5 is a circuit diagram showing the construction of a boost control circuit according to a first embodiment of the present invention.

FIG. 5 shows the construction of a boost control circuit 17 according to a first embodiment of the present invention, wherein those parts described already are designated by the same reference numerals and the description thereof will be omitted. It should be noted that the boost control circuit of FIG. 5 is used in the DRAM of FIG. 1 in place of the conventional boost control circuit of FIG. 3.

Referring to FIG. 5, the boost control circuit 17 has a construction substantially identical to that of the boost control circuit of FIG. 3, except that the n-channel MOS transistor 12 of FIG. 3 is replaced with an n-channel MOS transistor 19 having a gate width and hence a conductance substantially larger than that of the MOS transistor 12. For example, the transistor 19 has a gate width typically 1.5–2 times as large as the gate width of the transistor 12. The transistors 10, 11 and 19 form together an output circuit 18 that corresponds to the output circuit 9 of FIG. 3.

Figure 6:
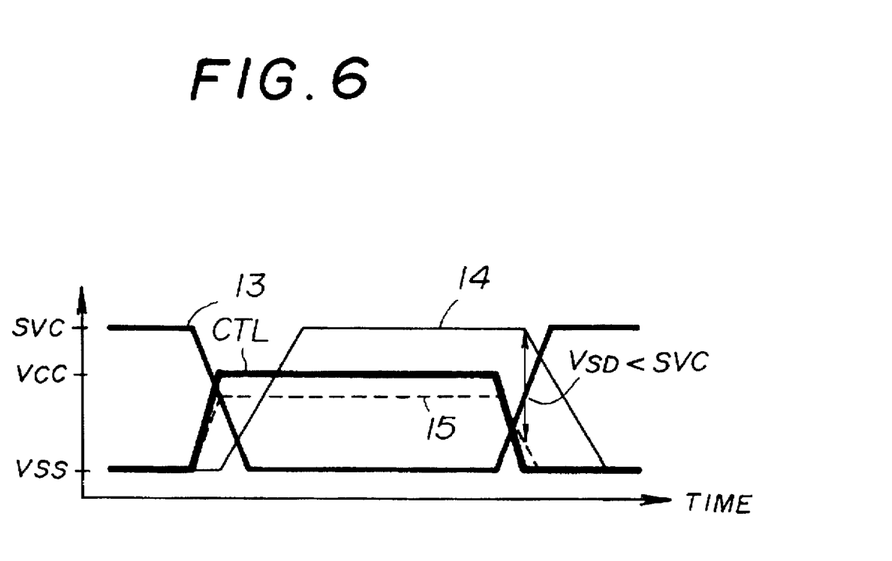
FIG. 6 is a timing chart showing the operation of the boost control circuit of FIG. 5.

FIG. 6 shows the operation of the circuit 17 of FIG. 5. Similarly to FIG. 4, FIG. 6 shows the change of voltage at the node 13 where the transistors 5 and 7 are connected with each other and the node 15 where the transistors 11 and 19 are connected with each other, in addition to the foregoing node 14 as well as the control signal CTL.

Referring to FIG. 6, it will be noted that the output of the inverter 8 is held high (Vcc level) as long as the control signal CTL is held low (Vss level), similarly as before, and the transistor 4 is turned off in response thereto. Associated therewith, it will be noted that the transistor 5 is turned on and the level of the node 13 is held at the SVC level. As the voltage of the node 13 is applied also to the gates of the transistors 10 and 11 of the output circuit 18, the transistor 10 is caused to turn off and the transistor 11 is caused to turn on, leading to the state in which the level of the nodes 14 and 15 is held at the Vss level (ground level).

When the level of the control signal CTL goes high in this state, the output of the inverter 8 goes low to the Vss level, and the p-channel MOS transistor 4 is caused to turn on while the p-channel MOS transistor 5 is caused to turn off. As a result, the voltage at the node 13 changes to the Vss level.

When the voltage at the node 13 goes low as such, the p-channel MOS transistor 10 of the output circuit 18 is caused to turn on while the n-channel MOS transistor 11 is caused to turn off, and the boost voltage SVC is supplied to the load 2 via the transistor 10. In this state, the node 14 is held at the SVC level while the node 15 is held at a level of SVC-VTH, wherein $V_{TH}$ represents the threshold voltage of the transistor 19.

When the control signal CTL goes low in this state, the output of the inverter 8 goes high to the Vcc level and the transistor 4 is turned off, the transistor 5 is turned on. Thereby, the voltage at the node 13 returns to the SVC level.

When the voltage of the node 13 has returned to the SVC level as such, the transistor 10 is caused to turn off and the transistor 11 is caused to turn on. Thereby, the electric charges accumulated in the load 2 are discharged via the transistors 19 and 11 to the ground. Associated with this, the level of the node 14 changes from the boost level SVC to the ground level Vss, and the level of the node 15 changes from the level of Vcc-$V_{TH}$ to the ground level Vss.

Since the transistor 19 has a conductance substantially exceeding the conductance of the transistor 11 as already noted, the transistor 19 can immediately compensate for any depletion of the electric charges occurring at the node 15 associated with the turning-on of the transistor 11, and the rate of change in the voltage level at the node 15 is slowed down as compared with the conventional case of FIG. 3 in which the transistor 12 has a conductance substantially identical with the conductance of the transistor 11. Thereby, excessive voltage drop across the transistor 19 is substantially suppressed, and the problem of degradation of the transistor 19 by the hot carriers, which in turn are induced by such a large voltage drop across the source and drain of the transistor 19, is successfully eliminated. In FIG. 6, it will be noted that the source-drain voltage VSD of the transistor 19, as represented as the voltage difference between the nodes 14 and 15, is substantially smaller than the boost voltage SVC, contrary to the case of FIG. 4. By using the boost control circuit of FIG. 5, one can improve the reliability of the DRAM as represented in FIG. 1.

Figure 7:
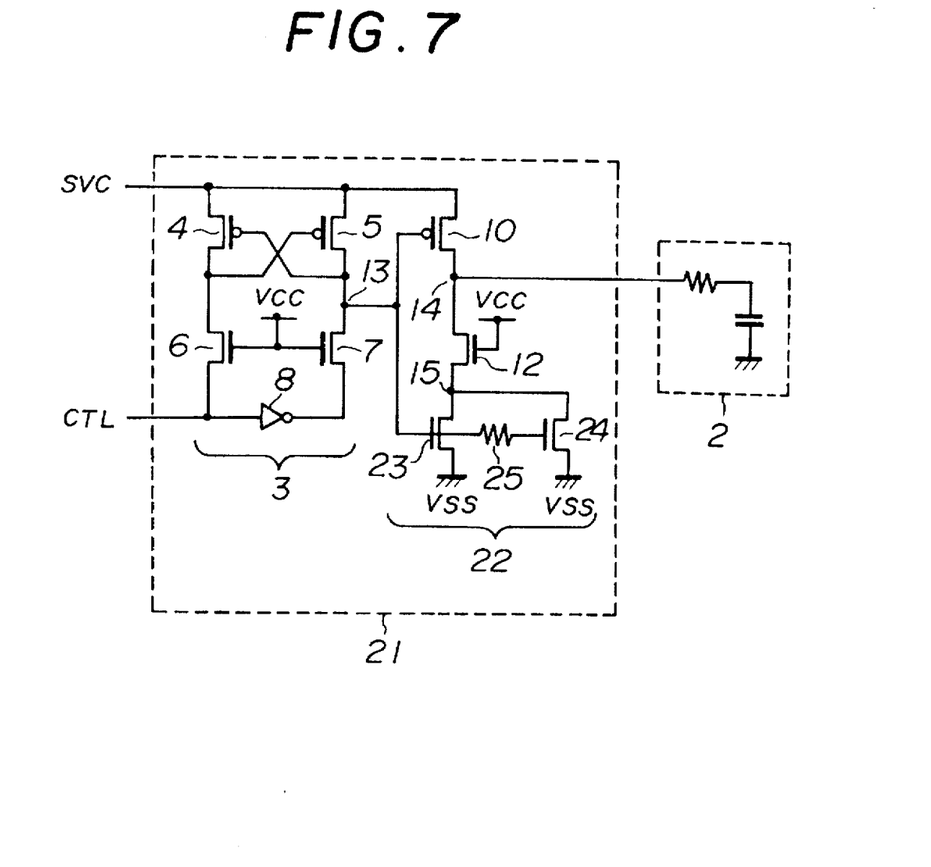
FIG. 7 is a circuit diagram showing the construction of a boost control circuit according to a second embodiment of the present invention.

FIG. 7 shows the construction of a boost control circuit 21 according to a second embodiment of the present invention. In FIG. 7, those parts corresponding to the parts described previously are designated by the same reference numerals and the description thereof will be omitted.

Referring to FIG. 7, the boost control circuit 21 has a construction substantially identical to that of the boost control circuit 1 of FIG. 4, except that the n-channel MOS transistor 11 of FIG. 4 is replaced with a pair of n-channel MOS transistors 23 and 24 connected parallel with each other between the node 15 and the ground level Vss. Further, the transistor 23 has a gate thereof connected to the node 13 commonly to the gate of the p-channel MOS transistor 10, while the transistor 24 has a gate connected to the gate of the transistor 23 and hence to the foregoing node 13 via a resistor 25. The resistor 25 is provided for adjusting the timing of turning-on of the transistors 23 and 24 as will be explained below.

It should be noted that the transistor 23 has a channel width smaller than the channel width of the transistor 12 and hence a smaller conductance. On the other hand, the transistor 24 has a channel width substantially larger than the channel width of the transistor 12 and has a correspondingly large conductance as compared with the transistor 12. The transistors 23 and 24 form an output circuit 22 together with the transistor 10.

Figure 8:
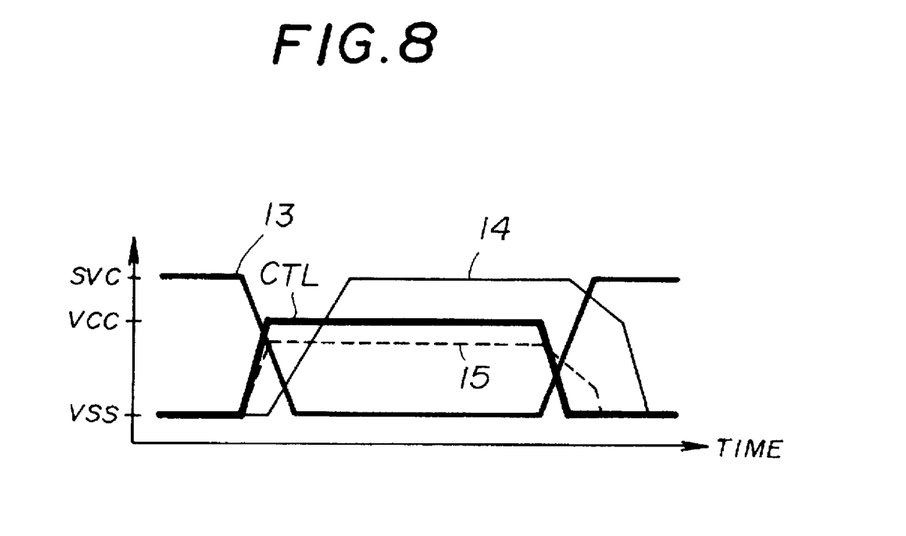
FIG. 8 is a timing chart showing the operation of the boost control circuit of FIG. 7.

FIG. 8 shows the operation of the circuit 21 of FIG. 7 in the form of a timing chart. Similarly to FIG. 6, FIG. 8 shows the change of voltage at the node 13 and the node 15, in addition to the foregoing node 14 as well as the control signal CTL.

Referring to FIG. 8, it will be noted that the output of the inverter 8 is held high (Vcc level) as long as the control signal CTL is held low (Vss level) similarly as before, and the transistor 4 is turned off in response thereto. Associated therewith, the transistor 5 is turned on and the level of the node 13 is held at the SVC level. As the voltage of the node 13 is applied also to the gate of the transistor 10 as well as to the gates of the transistors 23 and 24 of the output circuit 22, the transistor 10 is caused to turn off and the transistors 23 and 24 are turn on, leading to the state in which the level of the nodes 14 and 15 is held at the Vss level (ground level).

When the level of the control signal CTL goes high in this state, the output of the inverter 8 goes low to the Vss level, and the p-channel MOS transistor 4 is caused to turn on while the p-channel MOS transistor 5 is caused to turn off. As a result, the voltage at the node 13 changes to the Vss level.

When the voltage at the node 13 goes low as such, the p-channel MOS transistor 10 of the output circuit 18 is caused to turn on while the n-channel MOS transistors 23 and 24 are turned off, and the boost voltage SVC is supplied to the load 2 via the transistor 10. In this state, the node 14 is held at the SVC level while the node 15 is held at a level of SVC-$V_{TH}$, wherein $V_{TH}$ represents the threshold voltage of the transistor 12.

When the control signal CTL goes low in this state to the Vss level, the output of the inverter 8 goes high to the Vcc level and the transistor 4 is turned off, the transistor 5 is turned on. Thereby, the voltage at the node 13 returns to the SVC level.

When the voltage of the node 13 has returned to the SVC level as such, the transistor 10 turns off immediately. Further, the transistor 11 turns on immediately. On the other hand, the turning-on of the transistor 24 is delayed by the resistor 25. Thus, the electric charges accumulated in the load 2 are first discharged through the transistors 12 and 23, causing a gradual decrease of the voltage at the node 14 from the SVC level to the Vss level. Associated therewith, the level of the node 15 starts to cause a gradual decrease from the level of Vcc-$V_{TH}$ toward the Vss level. Meanwhile, the transistor 24 turns on, and the electric charges in the load 2 are discharged also through the transistor 24, in addition to the foregoing transistor 23 that is already turned on.

It should be noted that, as the transistor 23 has a channel width smaller than the channel width of the transistor 12 as already noted, the transistor 12 has a conductance larger than that of the transistor 23. Thus, in the interval where the transistor 23 is turned on but the transistor 24 is still turned off, the depletion of the electric charges at the node 15, caused by the turning-on of the transistor 23, is immediately compensated for by the electric charges supplied from the load 2 through the transistor 12, and the voltage level of the node 14 lowers gradually in correspondence to the gradual lowering of the voltage level of the node 14. Thereby, the problem of the boost voltage SVC applied across the source and drain of the transistor 12 is successfully eliminated.

Meanwhile, the transistor 24 is turned on, and the level of the node 15 drops sharply, followed by a sharp voltage drop at the node 14. Even in such a case, the boost voltage SVC is not applied across the transistor 12, as the level of the voltage at the node 14 has already lowered from the boost voltage SVC in response to the turning on of the transistor 23.

Thus, the boost control circuit of the present invention also eliminates the problem of deterioration of the transistor 12, which in turn is provided for eliminating the deterioration of the transistor 23. Because of the reduced gate width of the transistor 23 as compared with the transistor 12, the discharging occurs slowly at the beginning in the circuit of FIG. 7, while the overall interval of discharging is reduced substantially by providing the transistor 24 having a much larger gate width and hence a conductance in parallel to the transistor 23.

Next a boost control circuit 27 according to a third embodiment of the present invention will be described with reference to FIG. 9, wherein those parts described previously are designated by the same reference numerals and the description thereof will be omitted.

Figure 9:
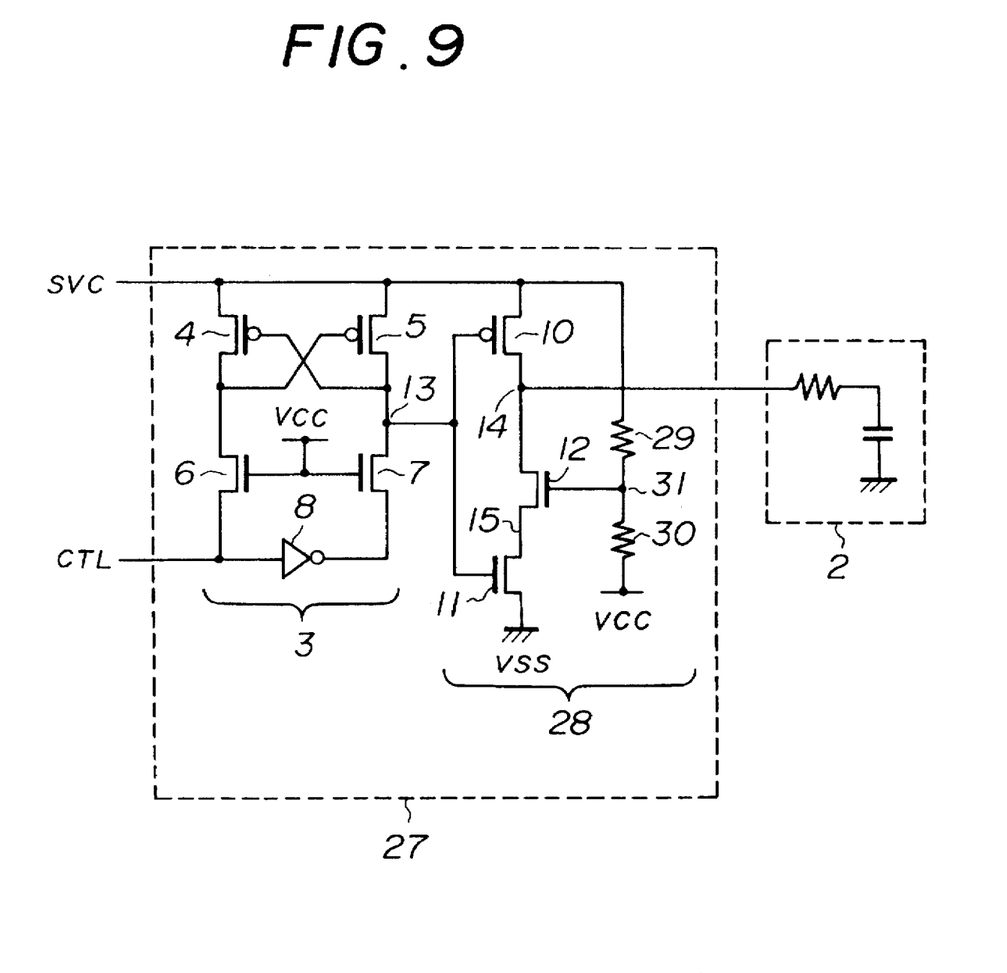
FIG. 9 is a circuit diagram showing the construction of a boost control circuit according to a third embodiment of the present invention.

The boost control circuit 27 of FIG. 9 has a construction similar to the circuit 1 of FIG. 3 except that an output circuit 28 is used in place of the output circuit 9 of FIG. 3.

Referring to FIG. 9, the output circuit 28 includes a voltage divider formed of resistors 29 and 30 connected in series between the SVC level and the Vcc level for dividing the boost voltage SVC at node 31, wherein the gate of the transistor 12 is connected to the node 31 between the resistor 29 and the resistor 30, rather than to the Vcc level voltage source. Thereby, the transistor 12 is biased at the level exceeding the Vcc level and the transistor 12 thus biases shows a conductance exceeding the conductance of the transistor 11.

As a result of the transistor 12 having a larger conductance as compared with the transistor 11, the voltage level at the node 15 goes low gradually in response to the turning on of the transistor 11. Associated therewith, the voltage level at the node 14 goes low gradually, and the problem of the boost voltage SVC applied across the drain and source of the transistor 12 is successfully eliminated.

In the present embodiment, too, one may further add an n-channel MOS transistor corresponding to the transistor 24 together with a resistor corresponding to the resistor 25, similarly to the second embodiment. By providing such an additional transistor having an increased gate width, it is possible to reduce the time needed for discharging the load 2.

Figure 10:
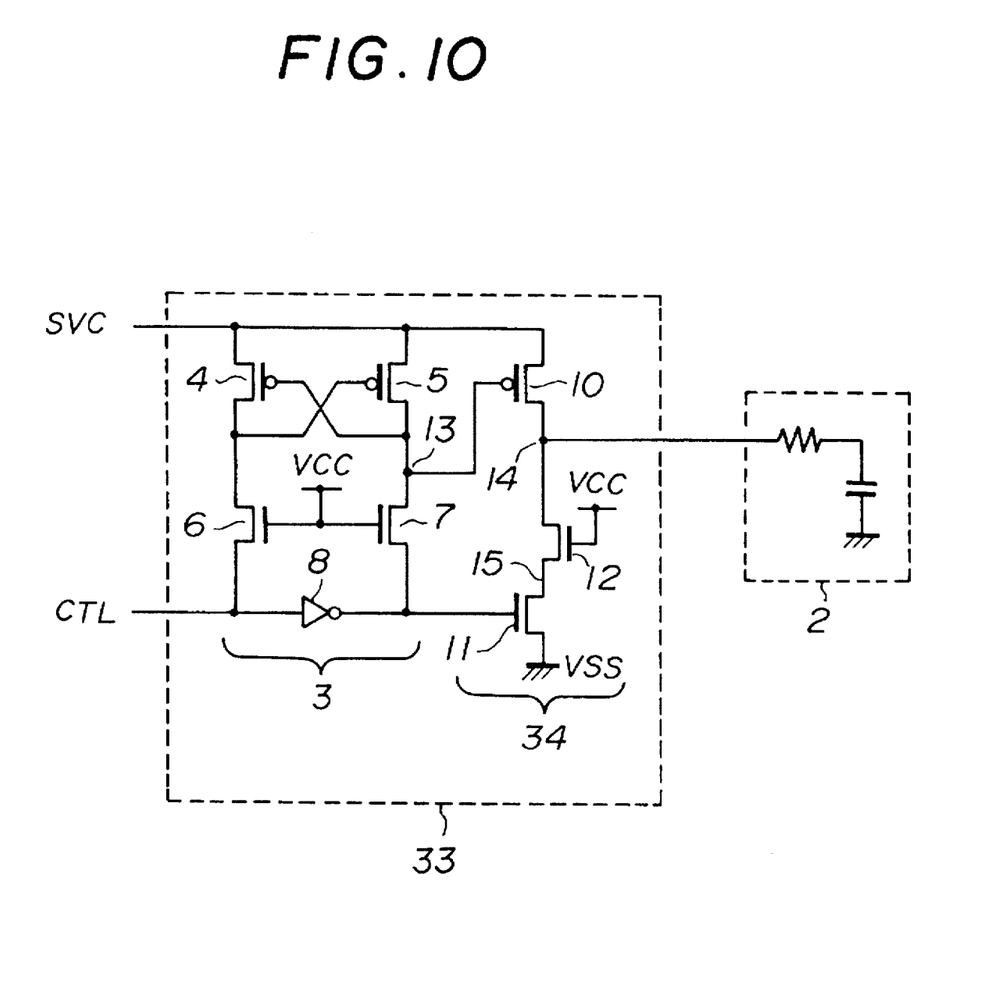
FIG. 10 is a circuit diagram showing the construction of a boost control circuit according to a fourth embodiment of the present invention.

FIG. 10 shows a boost control circuit 33 according to a fourth embodiment of the present invention. In FIG. 10, those parts corresponding to the parts described previously are designated by the same reference numerals and the description thereof will be omitted.

The boost control circuit 33 has a construction similar to the boost control circuit 1 of FIG. 3 except that the boost control circuit 33 includes an output circuit 34 in place of the output circuit 9 of FIG. 3.

Referring to FIG. 10, it will be noted that the gate of the n-channel MOS transistor 11 is connected to the output terminal of the inverter 8 rather than to the node 13. By doing so, the gate of the transistor 11 is applied with the supply voltage Vcc when turned on, rather than the boost voltage SVC at the node 13. Thereby, the conductance of the transistor 11 becomes inevitably smaller than in the case where the boost voltage SVC at the node 13 is supplied to the gate of the transistor 11. As a result, the voltage level at the node 15 goes low slowly when the transistor 11 is turned on, similarly to the previous embodiments, and the problem of the boost voltage SVC applied across the source and drain of the transistor 12 is successfully eliminated.

In the present embodiment, too, one may further add an n-channel MOS transistor corresponding to the transistor 24 together with a resistor corresponding to the resistor 25, similarly to the second embodiment. By providing such an additional transistor having an increased gate width, it is possible to reduce the time needed for discharging the load 2.

Figure 11:
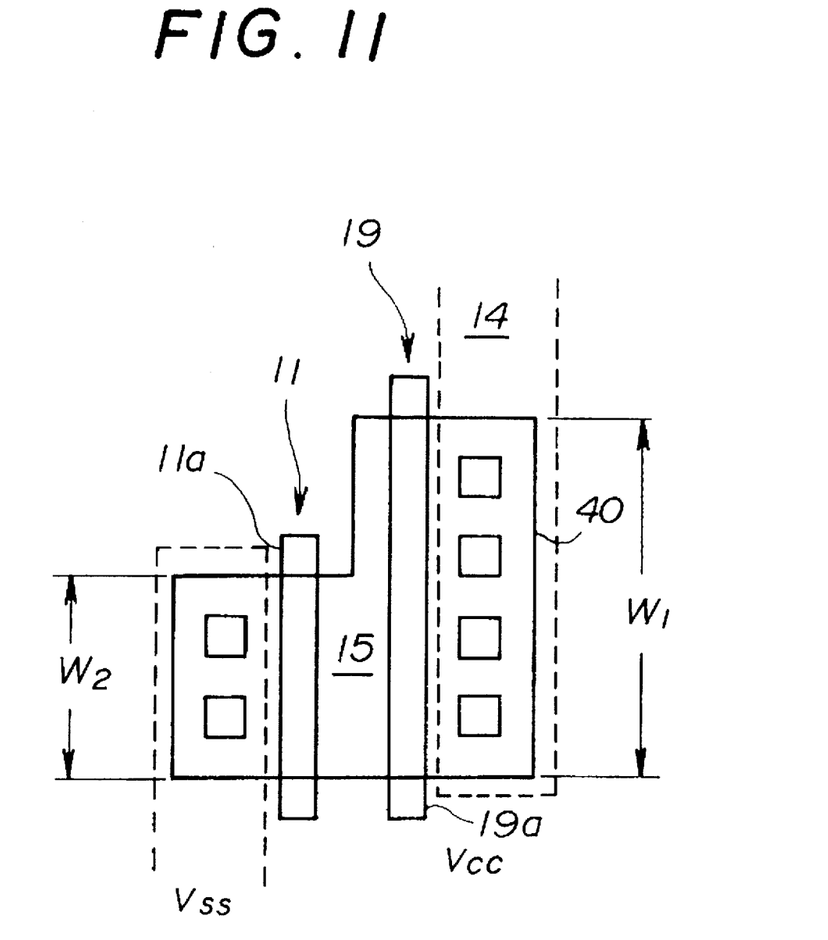
FIG. 11 is a diagram showing a layout of the transistors used in the boost control circuit according to the first embodiment of the present invention.

FIG. 11 shows the layout of the transistors 11 and 19 used in the circuit of FIG. 5.

Referring to FIG. 11, an n-type well 40 is formed in a semiconductor substrate such that the well 40 has a first width $W_1$ in correspondence to the region where the transistor 19 is formed and such that the well 40 has a second width $W_2$ ($W_2 < W_1$) in correspondence to the region where the transistor 11 is formed. Further, by providing a gate pattern on the well 40 in correspondence to the region where the width is $W_1$, the transistor 19 is formed. Similarly, by providing a gate pattern 11a on the well 40 in correspondence to the region where the width is $W_2$, the transistor 11 is formed. Thereby, it will be noted that the region of the well 40 between the gate patterns 19a and 11a acts as the foregoing node 15. Further, an output conductor pattern corresponding to the node 14 is connected to the other side of the well 40 with respect to the gate pattern 19a, and a ground pattern is connected to the well 40 at the other side of the region 15 with respect to the gate pattern 11a.

Figure 12:
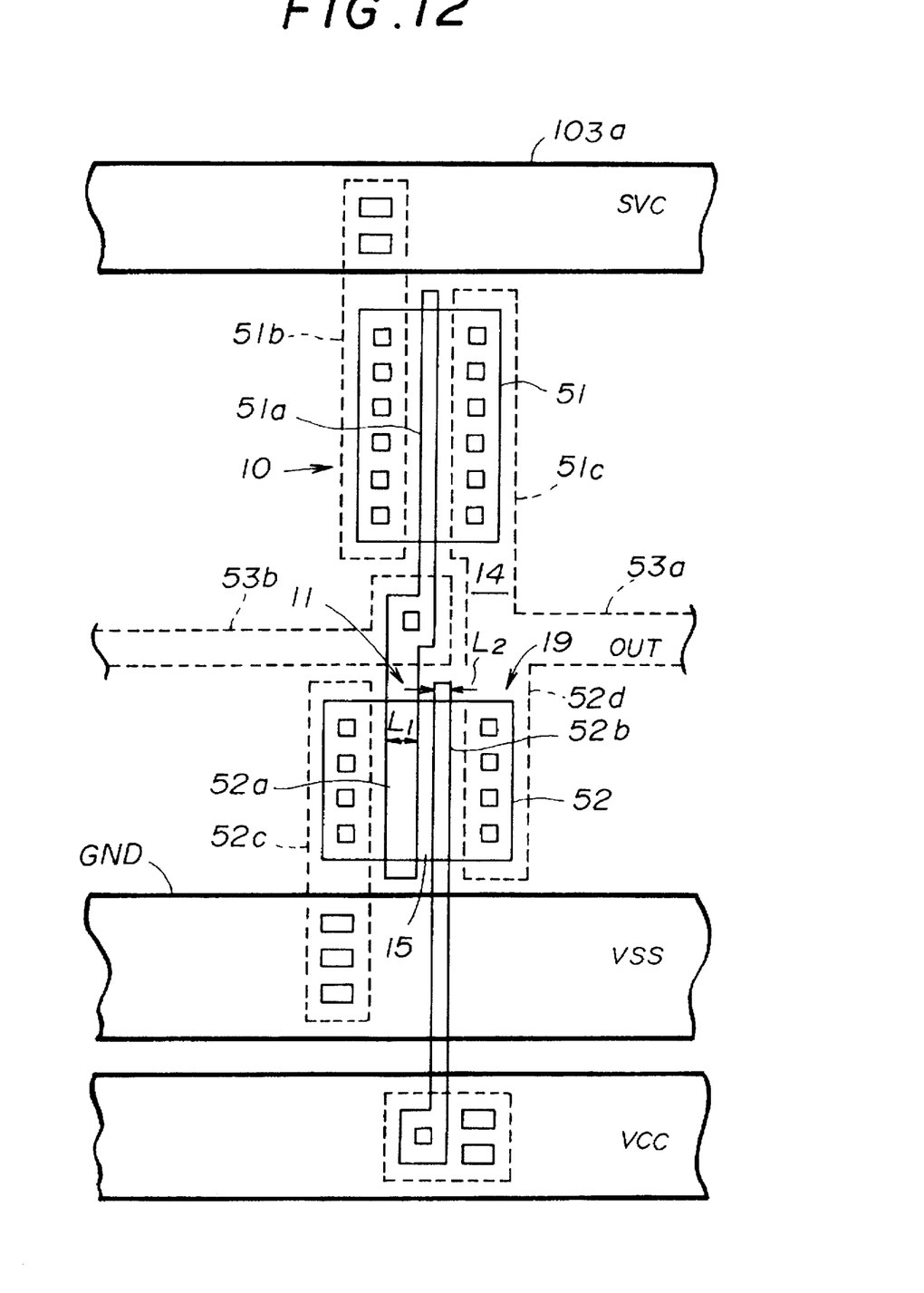
FIG. 12 is a diagram showing a layout of the transistors used in the boost control circuit according to a fifth embodiment of the present invention.

FIG. 12 shows a different layout of the circuit of FIG. 5 according to a fifth embodiment of the present invention.

Referring to FIG. 5, a p-channel well 51 is formed on a semiconductor substrate in correspondence to the p-channel transistor 10. Similarly, an n-channel well 52 is formed in correspondence to the n-channel transistors 11 and 19. Further, a gate pattern 51a acting as the gate of the p-channel transistor 10 bisects the p-channel well 51 into a first diffusion region connected to the conductor pattern 103a via a conductor pattern 51b, and further into a second diffusion region connected to the output load 2 via a conductor pattern 51c acting as the node 14. It should be noted that the conductor pattern 103a carries the SVC voltage as indicated in FIG. 1.

Further, the gate pattern 51a extends over the n-channel well 52 as a gate pattern 52a, wherein the gate pattern 52a forms the gate of the transistor 11. Thereby, the diffusion region at the left side of the gate pattern 52a in the illustrated example is connected to a ground pattern GND, which carries the Vss voltage, via a conductor pattern 52c. Further, another gate pattern 52b extends over the n-type diffusion region 52 at the right side of the gate pattern 52a as the gate of the transistor 19. It will be noted that the gate pattern 52a is connected to a conductor pattern that carries the supply voltage Vcc. Thereby, the region of the well 52 between the gate patterns 52a and 52b acts as the node 15 of FIG. 5, while the region at the right side of the gate pattern 52b is connected to the node 14 by a conductor pattern 52d, wherein the conductor pattern 52d merges with the conductor pattern 51c of the p-type well 51 and forms an output pattern 53a. Further, the gate patterns 51a and 52a are connected to an input conductor pattern 53b that leads to the node 13.

In the layout of FIG. 12, it will be noted that the gate pattern 52a has a width $L_1$ that is substantially larger than a width $L_2$ of the gate pattern 52b. In other words, the transistor 11 has a gate length $L_1$ substantially larger than the gate length $L_2$ of the transistor 19. In such a construction, too, the conductance of the transistor 19 becomes substantially larger than the conductance of the transistor 11 and the problem of deterioration of the transistor 19 is successfully avoided.

The layout of FIG. 12 is particularly advantageous for increasing the integration density of the device, since such a layout does not require complex modification in the shape of the diffusion well, contrary to the layout of FIG. 11. Further, the layout of FIG. 12 is advantageous in the point that the current density remains constant in the transistor 11 and in the transistor 12, and the dependence of the transistor performance on the device layout is minimized. Further, such a layout for changing the conductance by changing the gate length is achieved easily by merely changing the mask pattern for the gate polysilicon pattern.

Further, the present invention is not limited to the embodiments described heretofore, but various variations and modifications may be made without departing from the scope of the invention.

What is claimed is:

1. A semiconductor device, comprising:

a boost circuit producing a boost voltage by boosting a supply voltage; and a boost control circuit supplied with said boost voltage and outputting said boost voltage to a load in response to a control signal, said boost control circuit comprising:

a first transistor having a first diffusion region connected to said boost circuit and receiving the boost voltage produced thereby and a second diffusion region adapted for connection to said load for outputting said received boost voltage therefrom to said load, said first transistor being turned on to output said boost voltage from said second diffusion region to said load and being turned off when interrupting the output of said boost voltage from said second diffusion region to said load, a second transistor having a third electrode connected electrically to said second diffusion region of said first transistor and a fourth diffusion region, said second transistor being turned on irrespective of whether or not said first transistor is turned on, and a third transistor having a fifth electrode connected electrically to said fourth diffusion region of said second transistor and a sixth electrode connected electrically to a ground level, said third transistor being turned on when the output of said boost voltage from said second diffusion region to said load is interrupted and turned off when said boost voltage is output from said second diffusion region to said load, said second transistor having a conductance exceeding a conductance of said third transistor.

2. A semiconductor device as claimed in claim 1, wherein said second transistor has a gate width substantially larger than a gate width of said third transistor.

3. A semiconductor device as claimed in claim 1, wherein said second transistor has a gate length substantially smaller than a gate length of said third transistor.

4. A semiconductor device as claimed in claim 1, wherein said boost control circuit further comprises a fourth transistor connected in parallel to said third transistor, said fourth transistor having a conductance substantially exceeding the conductance of said third transistor, said fourth transistor having a gate connected to a gate of said third transistor via a resistor.

5. A semiconductor device as claimed in claim 4, wherein said resistor has a resistance set such that turning on of said fourth transistor occurs after said third transistor has turned on.

6. A semiconductor device as claimed in claim 1, wherein said second transistor is biased such that said conductance of said second transistor exceeds said conductance of said third transistor.

7. A semiconductor device as claimed in claim 6, wherein said boost control circuit further comprises a voltage divider connected between said boost voltage and said supply voltage and producing a bias voltage, said voltage divider biasing said second transistor by said bias voltage.

8. A semiconductor memory device, comprising:

a memory cell array including a plurality of memory cells;

a plurality of bit lines connected to respective memory cells;

a plurality of word lines connected to respective memory cells;

a bit decoder supplied with address data for selecting a bit line in response thereto;

a word decoder supplied with address data for selecting a word line in response thereto;

a boost circuit producing a boost voltage by boosting a supply voltage; and a boost control circuit supplied with said boost voltage and outputting said boost voltage to a load in response to a control signal, said boos control circuit comprising:

a first transistor having a first diffusion region connected to said boost circuit and receiving the boost voltage produced thereby and a second diffusion region adapted for connection to said load for outputting said received boost voltage therefrom to said load, said first transistor being turned on when outputting said boost voltage from said second diffusion region to said load and turned off when interrupting output of said boost voltage from said second diffusion region to said load, a second transistor having a third electrode connected electrically to said second diffusion region of said first transistor and a fourth diffusion region, said second transistor being turned on irrespective of whether or not said first transistor is turned on, and a third transistor having a fifth electrode connected electrically to said fourth diffusion region of said second transistor and a sixth electrode connected electrically to a ground level, said third transistor being turned on when the output of said boost voltage from said second diffusion region to said load is interrupted and turned off when said boost voltage is output from said second diffusion region to said load, said second transistor having a conductance exceeding a conductance of said third transistor.

9. A semiconductor memory device as claimed in claim 8, wherein said second transistor has a gate width substantially larger than a gate width of said third transistor.

10. A semiconductor memory device as claimed in claim 8, wherein said second transistor has a gate length substantially smaller than a gate length of said third transistor.

11. A semiconductor memory device as claimed in claim 8, wherein said boost control circuit further comprises a fourth transistor connected in parallel to said third transistor, said fourth transistor having a conductance substantially exceeding the conductance of said third transistor, said fourth transistor having a gate connected to a gate of said third transistor via a resistor.

12. A semiconductor memory device as claimed in claim 11, wherein said resistor has a resistance set such that turning on of said fourth transistor occurs after said third transistor has turned on.

13. A semiconductor memory device as claimed in claim 8, wherein said second transistor is biased such that said conductance of said second transistor exceeds said conductance of said third transistor.

14. A semiconductor memory device as claimed in claim 13, wherein said boost control circuit further comprises a voltage divider connected between said boost voltage and said supply voltage and producing a bias voltage, said voltage divider biasing said second transistor by said bias voltage.

15. A boost control circuit, comprising:

a first transistor having a first diffusion region connected to a boost circuit for receiving therefrom a boost voltage and a second diffusion region adapted for connection to a load for outputting said received boost voltage to said load, said first transistor being turned on when outputting said boost voltage from said second diffusion region to said load and turned off when interrupting output of said boost voltage from said second diffusion region to said load;

a second transistor having a third electrode connected electrically to said second diffusion region of said first transistor and a fourth diffusion region, said second transistor being turned on irrespective of whether or not said first transistor is turned on; and a third transistor having a fifth electrode connected electrically to said fourth diffusion region of said second transistor and a sixth electrode connected electrically to a ground level, said third transistor being turned on when the output of said boost voltage from said second diffusion region to said load is interrupted and turned off when said boost voltage is output from said second diffusion region to said load, said second transistor having a conductance exceeding a conductance of said third transistor.

16. A semiconductor device as claimed in claim 15, wherein said second transistor has a gate width substantially larger than a gate width of said third transistor.

17. A boost control circuit as claimed in claim 15, wherein said second transistor has a gate length substantially smaller than a gate length of said third transistor.

18. A boost control circuit as claimed in claim 17, wherein said boost control circuit further comprises a fourth transistor connected in parallel to said third transistor, said fourth transistor having a conductance substantially exceeding the conductance of said third transistor, said fourth transistor having a gate connected to a gate of said third transistor via a resistor.

19. A boost control circuit as claimed in claim 18, wherein said resistor has a resistance set such that turning on of said fourth transistor occurs after said third transistor has turned on.

20. A boost control circuit as claimed in claim 15, wherein said second transistor is biased such that said conductance of said second transistor exceeds said conductance of said third transistor.

21. A boost control circuit as claimed in claim 20, wherein said boost control circuit further comprises a voltage divider connected between said boost voltage and said supply voltage and producing a bias voltage, said voltage divider biasing said second transistor by said bias voltage.

22. A semiconductor control circuit, comprising:

a level conversion circuit supplied with an input signal for producing a first output signal with an amplitude larger than an amplitude of said input signal; and an inverter circuit comprising:

a p-channel transistor and a first n-channel transistor connected in series thereto, said p-channel transistor and said first n-channel transistor having respective gates connected commonly to said level conversion circuit for receiving said first output signal therefrom, said p-channel transistor having a drain and outputting a second, inverted output signal from said drain, and a second n-channel transistor interposed between said drain of said p-channel transistor and said first n-channel transistor, said second n-channel transistor being turned on when said first n-channel transistor is turned on, said second n-channel transistor having a conductance exceeding a conductance of said first n-channel transistor.

* * * * *

UNITED STATES PATENT AND TRADEMARK OFFICE
CERTIFICATE OF CORRECTION

PATENT NO. : 5,670,909
DATED : Sep. 23, 1997
INVENTOR(S) : KAWASAKI

It is certified that error appears in the above-identified patent and that said Letters Patent is hereby corrected as shown below:

TITLE PAGE: [56] References Cited, under "FOREIGN PATENT DOCUMENTS": change "401177714 A" to --1-177714--.

Col. 2, line 3, after "$N_2$" insert --,--; and after "boosted" insert --,--.

Col. 4, line 33, start a new paragraph with the words "a word".

Col. 7, line 21, change "VSD" to --$V_{SD}$--.

Col. 12, line 11 (Claim 8, line 15), change "boos" to --boost--.

Signed and Sealed this

Tenth Day of February, 1998

*Attest:*

BRUCE LEHMAN

*Attesting Officer*   *Commissioner of Patents and Trademarks*